(12) United States Patent
Feng et al.

(10) Patent No.: US 11,101,157 B2
(45) Date of Patent: Aug. 24, 2021

(54) SUBSTRATE PROCESSING SYSTEM (71) Applicant: Scientech Corporation, Taipei (TW)

(72) Inventors: Chuan-Chang Feng, Taipei (TW); Mao-Lin Liu, Taipei (TW); Ting-Yu Wu, Taipei (TW)

(73) Assignee: SCIENTECH CORPORATION, Taipei (TW)

( * ) Notice: Subject to any disclaimer, the term of this patent is extended or adjusted under 35 U.S.C. 154(b) by 504 days.

(21) Appl. No.: 16/204,511

(22) Filed: Nov. 29, 2018

(65) Prior Publication Data
US 2020/0126831 A1 Apr. 23, 2020

(30) Foreign Application Priority Data

Oct. 22, 2018 (TW) ................. 107137224

(51) Int. Cl.
*H01L 21/677* (2006.01)
*H01L 21/67* (2006.01)
*B08B 3/02* (2006.01)
*B08B 3/10* (2006.01)
*H01L 21/687* (2006.01)

(52) U.S. Cl.
CPC .......... *H01L 21/67742* (2013.01); *B08B 3/02* (2013.01); *B08B 3/102* (2013.01); *H01L 21/67034* (2013.01); *H01L 21/67051* (2013.01); *H01L 21/67057* (2013.01); *H01L 21/67173* (2013.01); *H01L 21/67207* (2013.01); *H01L 21/67754* (2013.01); *H01L 21/67766* (2013.01); *H01L 21/687* (2013.01)

(58) Field of Classification Search
None
See application file for complete search history.

(56) References Cited

U.S. PATENT DOCUMENTS

| 5,887,602 A | 3/1999 | Iwama |
| 7,850,817 B2 * | 12/2010 | Wakabayashi .... H01L 21/68707 156/345.12 |
| 8,211,242 B2 * | 7/2012 | Inoue ........................ B08B 1/04 134/56 R |

* cited by examiner

*Primary Examiner* — Rita P Adhlakha
(74) *Attorney, Agent, or Firm* — Muncy, Geissler, Olds & Lowe, P.C.

(57) ABSTRACT

A substrate processing system includes a substrate processing set and a substrate holding unit. The substrate processing set includes a substrate supporting part for supporting a vertical substrate. The substrate holding unit includes two cantilevers and two substrate holding parts. Each of the substrate holding parts is respectively located on each of the cantilevers. The two substrate holding parts are used for holding the substrate vertically. When the substrate holding unit moves next to the substrate processing set and the two substrate holding parts touch the substrate, the two substrate holding parts hold the substrate.

20 Claims, 11 Drawing Sheets

SUBSTRATE PROCESSING SYSTEM

BACKGROUND OF THE INVENTION

1. Field of the Invention

The present invention relates to a substrate processing system; more particularly, the present invention relates to a substrate processing system which can hold, place or transport a vertical substrate conveniently, and flip the substrate between the vertical state and the horizontal state, to accommodate various processes.

2. Description of the Related Art

In the semiconductor process, there is a need to execute several cleaning treatments on the substrate to remove impurities on the substrate surface, and after the substrate is etched to form a pattern, there is also a need to execute several cleaning treatments to remove the photoresist or the metal film on the substrate surface. In the common cleaning treatments, the substrate must first be soaked in a chemical liquid, then sprayed for washing, and finally rotated for drying. However, when the substrate is placed into the soaking, spraying or rotating machines, the substrate must be vertical or horizontal to accommodate the different machine designs.

Therefore, there is a need to provide a substrate processing system which can hold, place and transport a vertical substrate conveniently, and flip the substrate between the vertical state and the horizontal state, to accommodate various processes.

SUMMARY OF THE INVENTION

It is an object of the present invention to provide a substrate processing system which can hold, place and transport a vertical substrate conveniently, and flip the substrate between the vertical state and the horizontal state, to accommodate various processes.

To achieve the abovementioned object, the substrate processing system of the present invention includes a substrate processing set and a substrate holding unit. The substrate processing set includes a substrate supporting part. The substrate supporting part is used for supporting a substrate which is vertical. The substrate holding unit includes two cantilevers and two substrate holding parts. Each of the substrate holding parts are respectively located on each of the cantilevers. The two substrate holding parts are used for vertically holding the substrate. When the substrate holding unit moves close to the substrate processing set, and the two substrate holding parts contact the substrate, the two substrate holding parts will hold the substrate. The process of the substrate holding units holding the substrate includes the steps of: the two substrate holding parts descending to be lower than a first height; the two substrate holding parts moving horizontally and close to the substrate, and the two substrate holding parts respectively aligning with two sides of the substrate; the two substrate holding parts ascending to contact the two sides of the substrate; the two substrate holding parts ascending and holding the substrate such that the substrate leaves the substrate supporting part.

BRIEF DESCRIPTION OF THE DRAWINGS

These and other objects and advantages of the present invention will become apparent from the following to descriptions of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
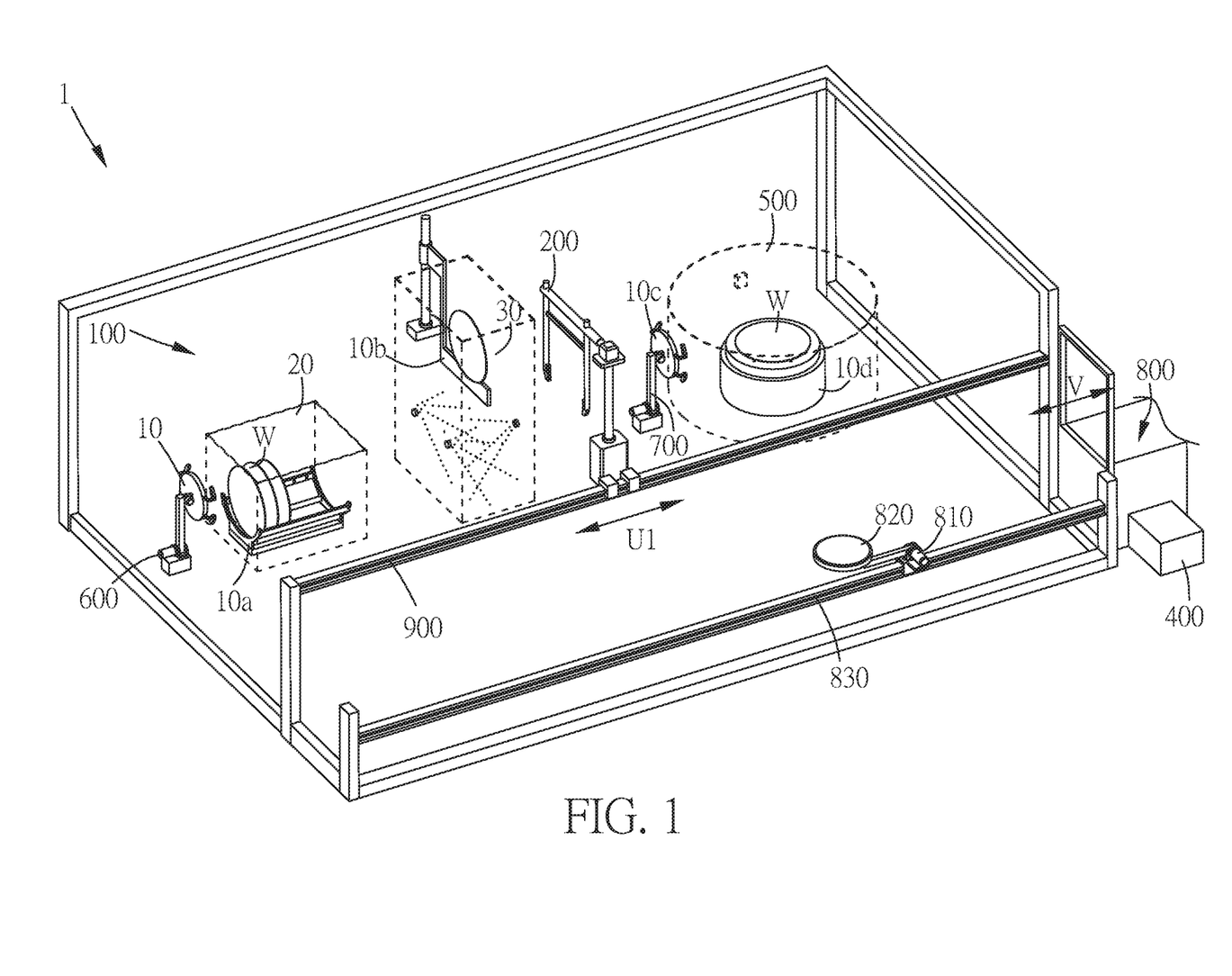
FIG. 1 illustrates a schematic drawing of the substrate processing system in a first embodiment of the present invention.
Figure 2:
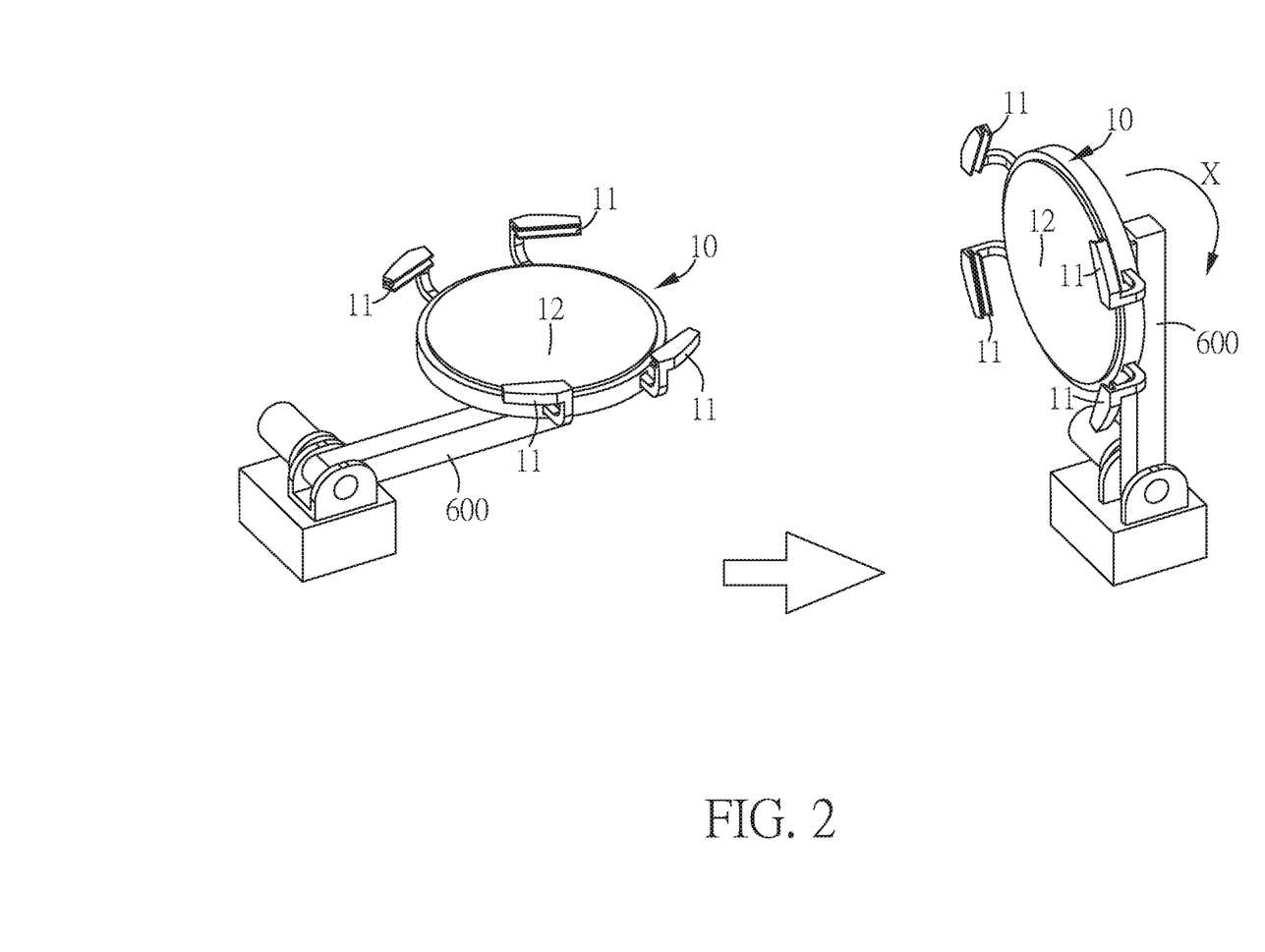
FIG. 2 illustrates a schematic drawing of the substrate supporting part flipping between the horizontal state and the vertical state in the first embodiment of the present invention.
Figure 3:
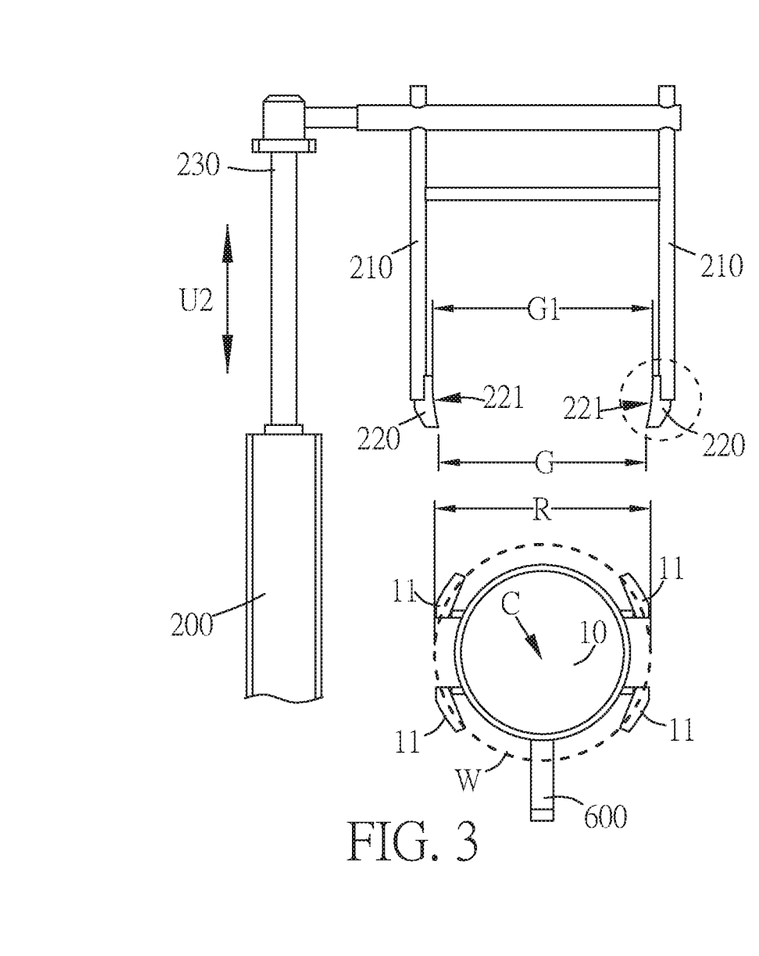
FIG. 3 illustrates a schematic drawing of the substrate holding unit close to the substrate supporting part in the first embodiment of the present invention.
Figure 4:
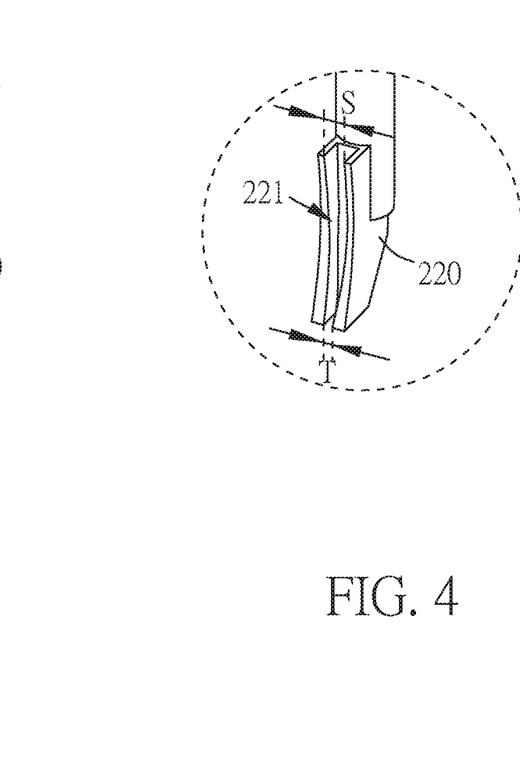
FIG. 4 illustrates a schematic drawing of the substrate holding part in the first embodiment of the present invention.
Figure 5:
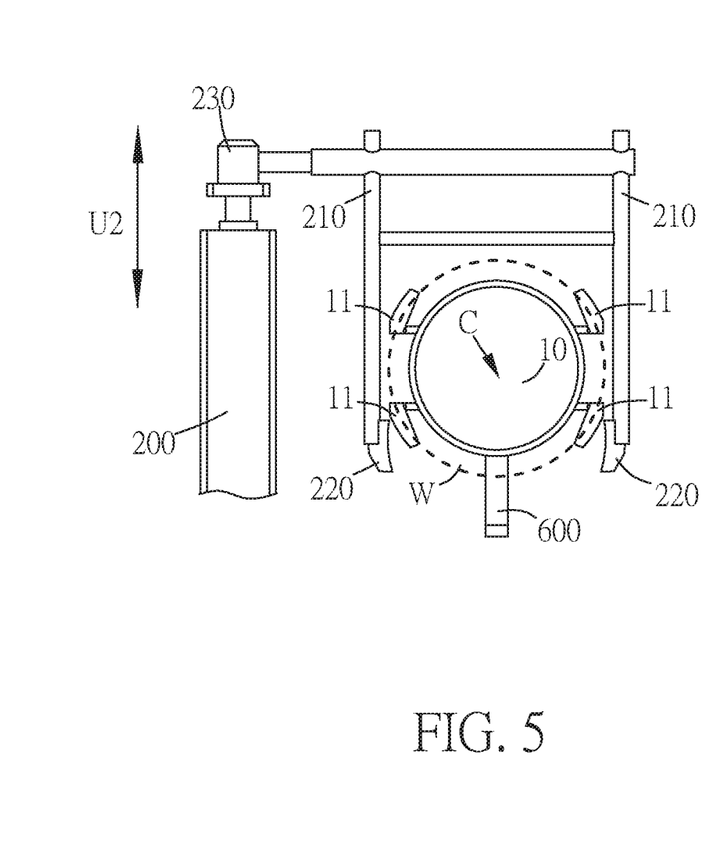
FIG. 5 illustrates a schematic drawing of the substrate holding part having descended to be lower than the first height in the first embodiment of the present invention.
Figure 6:
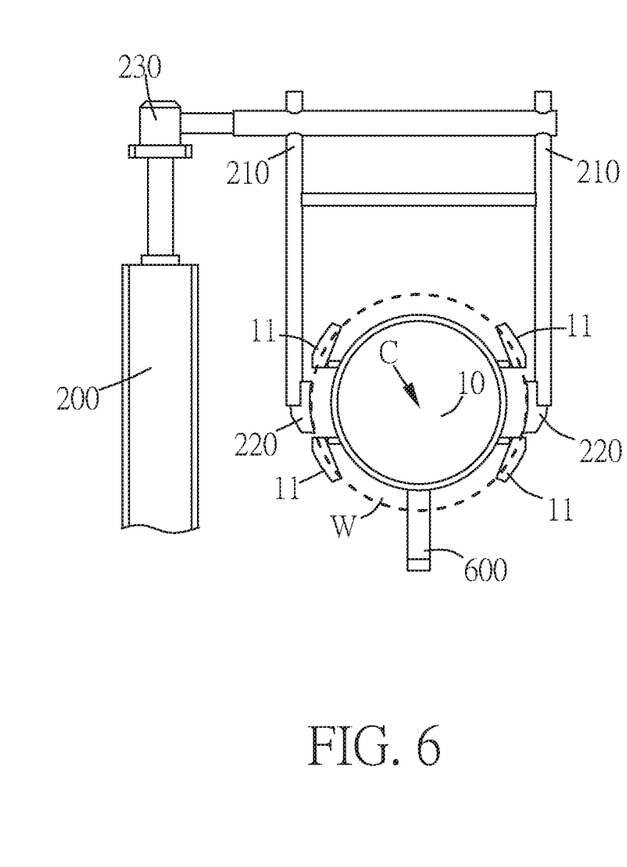
FIG. 6 illustrates a schematic drawing of the substrate holding part having ascended to touch the two sides of the substrate in the first embodiment of the present invention.
Figure 7:
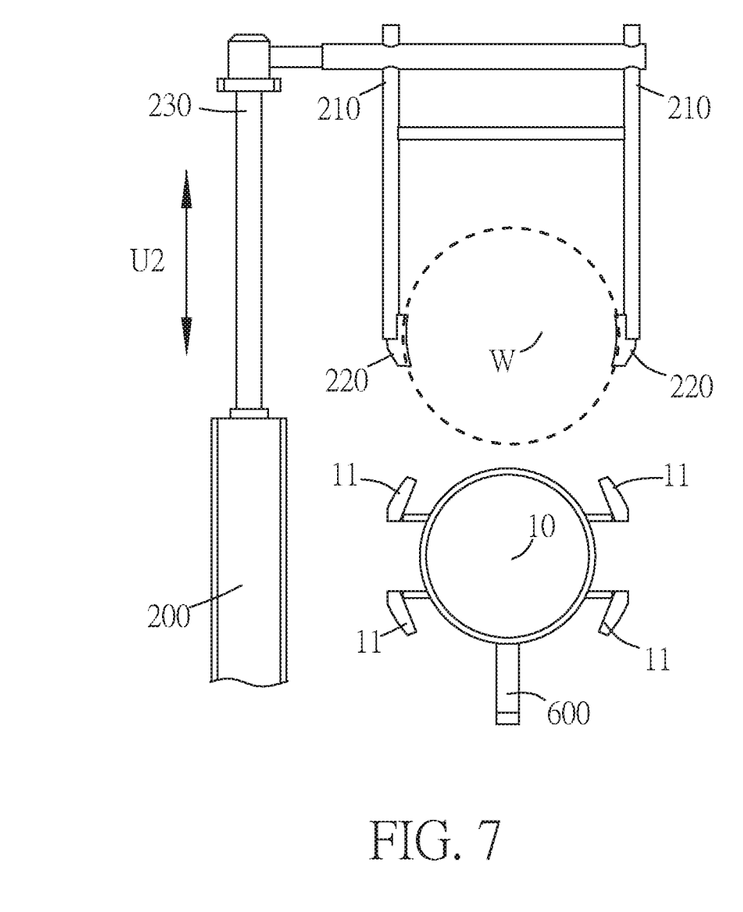
FIG. 7 illustrates a schematic drawing of the substrate holding part holding the substrate and having ascended such that the substrate has left the substrate supporting part in the first embodiment of the present invention.
Figure 8:
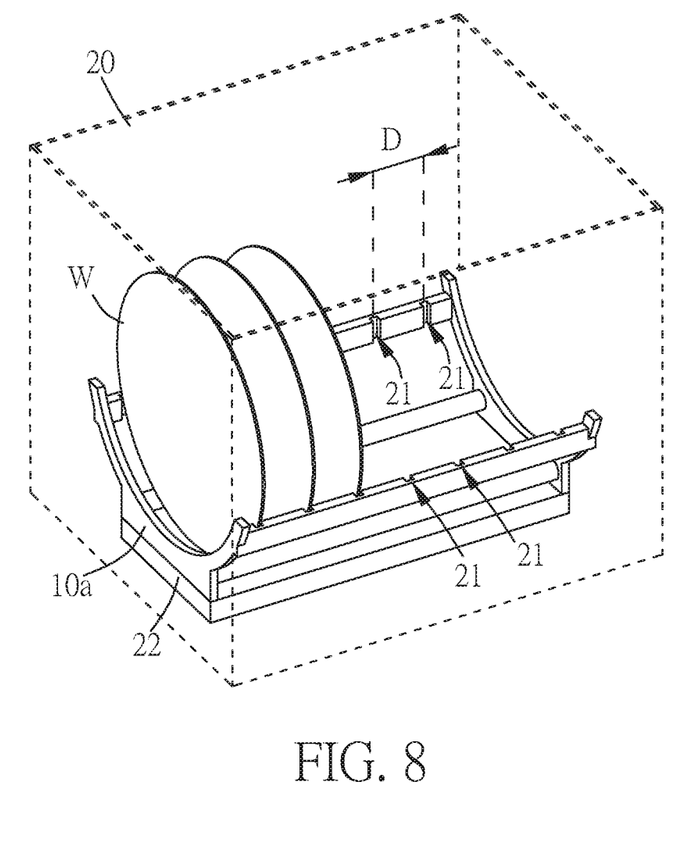
FIG. 8 illustrates a schematic drawing of the substrate on the substrate supporting part in the soaking tank in the first embodiment of the present invention.
Figure 9:
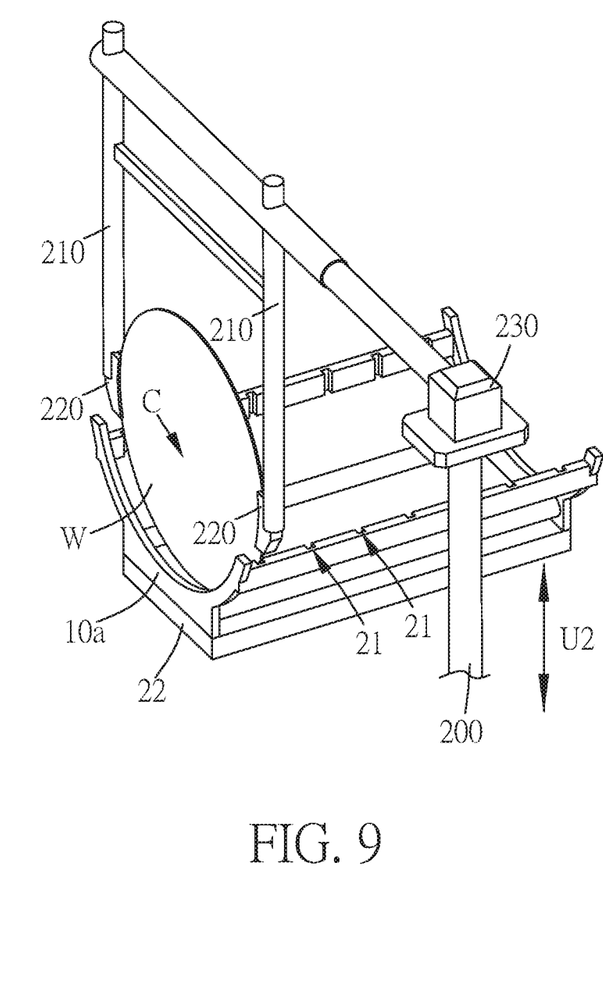
FIG. 9 illustrates a schematic drawing of the substrate held by the substrate holding part and placed on the substrate supporting part in the soaking tank in the first embodiment of the present invention.
Figure 10:
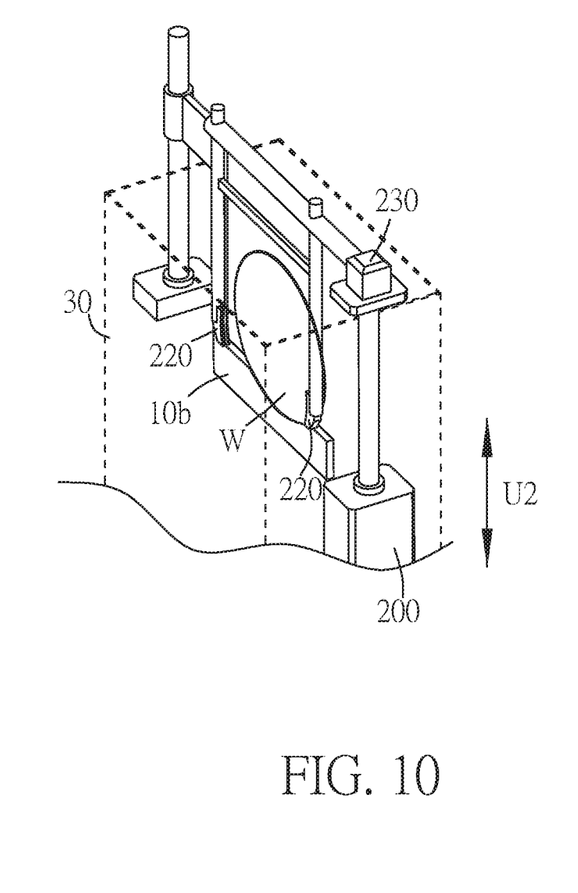
FIG. 10 illustrates a schematic drawing of the substrate held by the substrate holding part and placed on the substrate supporting part in the spray treatment tank in the first embodiment of the present invention.

Please refer to FIG. 1 to FIG. 10, which illustrate the substrate processing system in a first embodiment of the present invention. FIG. 1 illustrates a schematic drawing of the substrate processing system in a first embodiment of the present invention. FIG. 2 illustrates a schematic drawing of the substrate supporting part flipping between the horizontal state and the vertical state in the first embodiment of the present invention. FIG. 3 illustrates a schematic drawing of the substrate holding unit close to the substrate supporting part in the first embodiment of the present invention. FIG. 4 illustrates a schematic drawing of the substrate holding part in the first embodiment of the present invention. FIG. 5 illustrates a schematic drawing of the substrate holding part having descended to be lower than the first height in the first embodiment of the present invention. FIG. 6 illustrates a schematic drawing of the substrate holding part having ascended to touch the two sides of the substrate in the first embodiment of the present invention. FIG. 7 illustrates a schematic drawing of the substrate holding part holding the substrate and having ascended such that the substrate has left the substrate supporting part in the first embodiment of the present invention. FIG. 8 illustrates a schematic drawing of the substrate on the substrate supporting part in the soaking tank in the first embodiment of the present invention. FIG. 9 illustrates a schematic drawing of the substrate held by the substrate holding part and placed on the substrate supporting part in the soaking tank in the first embodiment of the present invention. FIG. 10 illustrates a schematic drawing of the substrate held by the substrate holding part and placed on the substrate supporting part in the spray treatment tank in the first embodiment of the present invention.

As shown in FIG. 1, in the first embodiment, the substrate processing system 1 can hold, place or transport a substrate W which is in the vertical state, and flip the substrate W between the horizontal state and the vertical state, to accommodate various processes. The substrate processing system 1 includes a substrate processing set 100, a substrate holding unit 200, a controlling unit 400, a cleaning and drying tank 500, a first substrate flipping machine 600, a second substrate flipping machine 700, a substrate inputting and outputting unit 800 and a sliding rail set 900.

As shown in FIG. 1 to FIG. 3, the substrate processing set 100 includes a plurality of substrate supporting parts 10, 10a, 10b, 10c, 10d, a soaking tank 20 and a spray treatment tank 30. The substrate supporting parts 10, 10a, 10b, 10c, 10d are used for supporting the vertical substrate W. Two of the substrate supporting parts 10, 10c are respectively pivotally connected to the first substrate flipping machine 600 and the second substrate flipping machine 700. The first substrate flipping machine 600 and the second substrate flipping machine 700 can rotate the two substrate supporting parts 10, 10c such that they are vertical or horizontal. The two substrate supporting parts 10, 10c both have four containers 11 and a main body 12. The four containers 11 are arc-shaped containing grooves and movably connected to the main body 12. However, the amount and shape of the containers 11 are not limited to the abovementioned description; the amount and shape can be changed according to design requirements. For example, the container 11 can also be a semicircular containing groove. The four containers 11 can expand or contract relative to the main body 12 to hold the substrate W; the substrate supporting parts 10, 10c can also respectively rotate relative to the first substrate flipping machine 600 and the second substrate flipping machine 700 along the rotating direction X such that the main bodies 12 of the substrate supporting parts 10, 10c are oriented in various directions. When the substrate W is flipped between the horizontal state and the vertical state, the edge of the substrate W is fixed by the four containers 11. When the substrate W is in the vertical state, the substrate W is erect on two of the containers 11 such that the substrate holding unit 200 can transport the vertical substrate W. It is to be known that the four containers 11 are only used for fixing the substrate W for flipping between the horizontal state and the vertical state; the four containers 11 do not clamp the substrate W and thus will not damage the substrate W.

The other three substrate supporting parts 10a, 10b, 10d are respectively located in the soaking tank 20, the spray treatment tank 30 and the cleaning and drying tank 500. The substrate supporting part 10a in the soaking tank 20 is a U-shaped bracket for containing a plurality of vertical substrates W. The substrate supporting part 10b in the spray treatment tank 30 is an L-shaped board with a groove for containing one single vertical substrate W; the substrate supporting part 10b can be lifted such that the L-shaped board can descend into the spray treatment tank 30 and ascend to the top of the spray treatment tank 30 or be partially exposed to the outside. The substrate supporting part 10d in the cleaning and drying tank 500 can contain one single horizontal substrate W. However, the substrate supporting parts 10, 10a, 10b, 10c, 10d are used for containing each of the substrates W to accommodate various processes, and are used for holding, placing and transporting each of the substrates W with the substrate holding unit 200 or the substrate flipping machine; thus, the shapes of the substrate supporting parts 10, 10a, 10b, 10c, 10d are not limited to the abovementioned description and can be changed according to design requirements.

As shown in FIG. 1, FIG. 8 and FIG. 9, the soaking tank 20 is used for executing a vertical soaking treatment on one or more vertical substrates W. The soaking tank 20 includes a plurality of slots 21 and a vibration device 22. The plurality of slots 21 are located on the substrate supporting part 10a for containing the plurality of substrates W. A gap between two neighboring slots 21 is at least more than a first distance D so as to allow the substrate holding unit 200 sufficient movement space for entering or leaving the soaking tank 20 without causing the substrates W to impact each of the slots 21. The vibration device 22 is located under the substrate supporting part 10a and causes the substrate supporting part 10a to vibrate and increase the soaking force during the execution of a vibration soaking treatment on the substrate W on the substrate supporting part 10a. The substrate holding unit 200 can vertically place a plurality of substrates W on the plurality of slots 21 to execute a batch immersion treatment on the plurality of substrates W. However, the treatment which is executed by the soaking tank 20 for the substrate W is not limited to the batch immersion treatment; the soaking tank 20 can also be designed to accommodate the substrate holding unit 200 such that the substrate holding unit 200 only vertically places one single substrate W on one of the slots 21 at a time, and the soaking tank 20 only executes the soaking treatment on one single substrate W at a time. After the soaking is completed, the substrate holding unit 200 successively transports other substrates W into the soaking tank 20 to successively execute the soaking treatment on the substrates W. Alternatively, the treatment executed by the soaking tank 20 on the substrate W can be changed to accommodate the substrate holding unit 200 such that the substrate holding unit 200 can successively transport each of the substrates W into the soaking tank 20 to successively execute the soaking treatment on each of the substrates W; the substrate holding unit 200 also successively removes the substrates W after they have soaked for a certain period of time to transport the substrates W to the spray treatment tank 30. During the process of the substrate holding unit 200 successively transporting the substrates W to the soaking tank 20 for execution of the soaking treatment, the substrates W in the soaking tank 20 remain in the soaking treatment, such that each of the substrates W can be soaked respectively. The plurality of slots 21 are located on the substrate supporting part 10a, and the substrate holding unit 200 holds, places and transports each of the substrates W to each of the plurality of slots 21.

As shown in FIG. 1 and FIG. 10, the spray treatment tank 30 is a tank with a spray port for spraying a cleaning liquid onto the vertical substrate W on the substrate supporting part 10b to execute a vertical spray treatment on the substrate W. However, the cleaning method of the spray treatment tank 30 for the substrate W is not limited to the spray treatment; the spray treatment tank 30 can be changed to another machine with cleaning and drying functions for cleaning and drying a substrate W.

As shown in FIG. 1, FIG. 3 and FIG. 4, the substrate holding unit 200 is located on a sliding rail set 900 such that the substrate holding unit 200 can slide on the sliding rail set 900 along the moving direction U1. The substrate holding unit 200 includes two cantilevers 210, two substrate holding parts 220 and a lifting unit 230. The two cantilevers 210 are connected to the lifting unit 230. In this embodiment, a stable gap is between the two cantilevers 210, and the two cantilevers 210 are immovably connected to the lifting unit 230. The lifting unit 230 can stretch along the moving direction U2 to cause the two cantilevers 210 to move up and down. The two substrate holding parts 220 are respectively and symmetrically located on each of the cantilevers 210, and a slot spacing G between the two substrate holding parts 220 is less than a substrate diameter R of the substrate W. The two substrate holding parts 220 are used for vertically holding the substrate W. Each of the substrate holding parts 220 includes a trench 221. Each of the trenches 221 can be a curved or triangular trough. In one embodiment, each of the trenches 221 includes a bottom spacing T and a top spacing S; the bottom spacing T is less than the top spacing S, and the two trenches 221 are symmetrically located for respectively contacting the two sides of the substrate W which should be held. Because the bottom spacing T is less than the top spacing S, and because the slot spacing G between the two substrate holding parts 220 is less than the substrate diameter R of the substrate W, the two substrate holding parts 220 can be caused by the two cantilevers 210 to ascend and to lift the substrate W off the substrate supporting part 10, or the two substrate holding parts 220 can be caused by the two cantilevers 210 to descend to place the substrate W on the substrate supporting part 10 and then leave the substrate W. In another embodiment, via the shape and the gap between the two trenches 221 of the two substrate holding parts 220, and the wide-top-and-narrow-bottom shape of the two trenches 221 (which means that the slot spacing G1 between the tops of the two trenches 221 of the two substrate holding parts 220 is wider than the slot spacing G between the bottoms of the two trenches 221), the two substrate holding parts 220 can be caused by the two cantilevers 210 to ascend and to lift the substrate W off the substrate supporting part 10, or the two substrate holding parts 220 can be caused by the two cantilevers 210 to descend and to place the substrate W on the substrate supporting part 10 and leave the substrate W. However, it is to be known that the two substrate holding parts 220 only hold the substrate W; the two substrate holding parts 220 do not clamp the substrate W, so the two substrate holding parts 220 will not damage the substrate W. Moreover, the technology of the lifting unit 230 achieving such displacement is already applied in many mechanical devices; because it is not the focus of the present invention, there is no need for furthermore description.

As shown in FIG. 1, the controlling unit 400 is a computer host for controlling each component of the substrate processing system 1 to work for execution of the treatment on the substrate W. The cleaning and drying tank 500 has a spray port and an air outlet for washing the substrate W horizontally placed on the substrate supporting part 10d and blowing hot air to dry the substrate W. However, the substrate supporting part 10d can also be designed to hold the vertical substrate W; therefore, the cleaning and drying tank 500 can clean the two faces of the vertical substrate W.

As shown in FIG. 1 to FIG. 3, the first substrate flipping machine 600 is fixed on a plane. The first substrate flipping machine 600 is a rotation arm, which can cause the substrate supporting part 10 to rotate to be horizontal or vertical; whereby, the first substrate flipping machine 600 can flip the substrate W on the substrate supporting part 10 between the horizontal state and the vertical state to transport the vertical substrate W with the substrate holding unit 200. The second substrate flipping machine 700 is located next to the substrate supporting part 10d of the cleaning and drying tank 500. The second substrate flipping machine 700 is a rotation arm, which can cause the substrate supporting part 10c to rotate to be horizontal or vertical; whereby, the second substrate flipping machine 700 can flip the substrate W on the substrate supporting part 10c between the horizontal state and the vertical state to transport the vertical substrate W with the substrate holding unit 200 or to place the horizontal substrate W on the substrate supporting part 10d in the cleaning and drying tank 500. The substrate inputting and outputting unit 800 is a two-way conveying machine for inputting or outputting each of the substrates W into or from the substrate processing set 100 along the inputting and outputting direction V. The substrate inputting and outputting unit 800 includes a moving part 810, a receiving board 820 and a substrate inputting and outputting unit track 830. The moving part 810 is pivotally connected to the receiving board 820, and the moving part 810 can slide along the substrate inputting and outputting unit track 830. The moving part 810 has a structure with a telescoping function such that the moving part 810 can extend along the direction vertical to the substrate inputting and outputting unit track 830 such that the receiving board 820 can be close to the first substrate flipping machine 600. The receiving board 820 is used for receiving the substrate W, and the receiving board 820 can be caused by the moving part 810 to move along the substrate inputting and outputting unit track 830.

When the user wants to use the substrate processing system 1 of the present invention to process a substrate W, as shown in FIG. 1 and FIG. 2, first, the user can operate the controlling unit 400 to control the substrate inputting and outputting unit 800 to input the substrate W which is in the horizontal state; via the movement and the extension of the moving part 810 and the receiving function of the receiving board 820 for the substrate W, the substrate W can be transported to the first substrate flipping machine 600. The main body 12 on the first substrate flipping machine 600 receives the substrate W, and the containers 11 hold the edge of the substrate W; whereby, the substrate W in the horizontal state is transported to the first substrate flipping machine 600 and stably held by the substrate supporting part 10 such that the substrate W can be transported to the soaking tank 20 for the wet treatment.

Before the substrate W in the horizontal state is transported to the soaking tank 20, as shown in FIG. 1 to FIG. 3, the rotation arm of the first substrate flipping machine 600 rotates from the horizontal state to the vertical state and causes the horizontal substrate supporting part 10 and the substrate W supported by the substrate supporting part 10 to be vertical; then the four containers 11 are controlled to open and to release the edge of the substrate W such that the substrate W can leave the substrate supporting part 10 smoothly. Then the controlling unit 400 controls the substrate holding unit 200 to move to be next to the substrate processing set 100 such that the substrate holding unit 200 can hold the substrate W supported by the substrate supporting part 10.

As shown in FIG. 1, FIG. 3, FIG. 5 and FIG. 6, when the substrate holding unit 200 starts to hold the substrate W which is supported by the substrate supporting part 10, first, the controlling unit 400 controls the lifting unit 230 to retract along the moving direction U2 to cause the two substrate holding parts 220 to descend to be lower than the first height. The first height of this embodiment is the height of the substrate center C of the substrate W, but the first height can also be changed to a height which is lower than the substrate center C of the vertical substrate W; besides, since the shape of the substrate W is not limited to round, the shape can also be a square or an oval, so the first height is not limited to the height of the substrate center C and can be changed to be lower than half of the height of vertical substrate W. Then the controlling unit 400 controls the substrate holding unit 200 to horizontally move on the sliding rail set 900 towards the substrate such that the two substrate holding parts 220 horizontally move towards the substrate W and the two substrate holding parts 220 are respectively aligned with the two sides of the substrate W. Then the controlling unit 400 controls the lifting unit 230 to extend along the moving direction U2 to cause the two substrate holding parts 220 to rise and contact the two sides of the substrate W; at this moment, because the slot spacing G between the two substrate holding parts 220 is less than the substrate diameter R of the substrate W, the two substrate holding parts 220 can hold the substrate W. Then, as shown in FIG. 1 and FIG. 7, the controlling unit 400 controls the lifting unit 230 to extend along the moving direction U2 to further cause the two substrate holding parts 220 to hold the substrate W and rise such that the substrate W is lifted from the substrate supporting part 10. However, it is to be known that the actions in the abovementioned process of the substrate holding unit 200 holding the substrate W are the observable behaviors for individual time points; according to the treatment requirements, other actions or pause times may occur or exist between the abovementioned actions, or the abovementioned actions can be designed to be continuous actions. It is to be known that the two substrate holding parts 220 need not be aligned with the two sides of the substrate W for holding the substrate W from the left and the right sides; the two substrate holding parts 220 can also be designed to hold the bottom of the substrate W for raising the substrate W, and the slot spacing G between the two substrate holding parts 220 can be correspondingly changed to a smaller distance.

Then, as shown in FIG. 1, FIG. 8 and FIG. 9, the controlling unit 400 controls the substrate holding unit 200 to move to be close to the soaking tank 20 and controls the lifting unit 230 to extend along the moving direction U2 such that the two substrate holding parts 220 move above the substrate supporting part 10a and prepare to place the substrate W on the substrate supporting part 10a for execution of the soaking treatment. Then the controlling unit 400 controls the lifting unit 230 to retract along the moving direction U2 such that the two substrate holding parts 220 which hold the substrate W descend to place the substrate W on the substrate supporting part 10a and cause the two sides of the substrate W respectively to be located in slot 21. Then the controlling unit 400 controls the lifting unit 230 to continue retracting along the moving direction U2 such that the two substrate holding parts 220 continue descending to be lower than the first height and leave the substrate W. Then the controlling unit 400 controls the substrate holding unit 200 to move for a first distance D on the sliding rail set 900 to cause the two substrate holding parts 220 to horizontally move for the first distance D such that the two substrate holding parts 220 leave the substrate W. Then the controlling unit 400 controls the lifting unit 230 to extend along the moving direction U2 to cause the two substrate holding parts 220 to rise and leave the substrate supporting part 10a of the substrate processing set 100. Thus, the substrate W can be placed on the substrate supporting part 10a in the soaking tank 20. If there is a need to execute the vibration soaking treatment on the substrate W, the controlling unit 400 can also control the vibration device 22 to cause the substrate supporting part 10a to vibrate continously; therefore, the two substrate holding parts 220 can place the substrate W on the vibrating substrate supporting part 10a and leave the substrate W such that the substrate W is in the vibration soaking treatment. After the soaking treatment is completed, the two substrate holding parts 220 can lift the substrate W from the vibrating substrate supporting part 10a for the subsequent process.

As shown in FIG. 1 and FIG. 10, after the two substrate holding parts 220 lift the substrate W from the soaking tank 20 and the substrate supporting part 10a, the controlling unit 400 controls the substrate holding unit 200 to transport the substrate W from the soaking tank 20 to the substrate supporting part 10b in the spray treatment tank 30 for execution of the spray treatment on the substrate W, such as spraying a chemical liquid or pure water, but the liquid type is not limited to that design. It is to be known that, because the action of the substrate holding unit 200 retrieving the substrate W from the substrate supporting part 10a and transporting the substrate W to the substrate supporting part 10b is the same as the action of the substrate holding unit 200 retrieving the substrate W from the vertical substrate supporting part 10 and transporting the substrate W to the substrate supporting part 10a, there is no need for further description of the action of the substrate holding unit 200 retrieving the substrate W from the substrate supporting part 10a and transporting it to the substrate supporting part 10b.

After the spray treatment is completed, the two substrate holding parts 220 can hold the substrate W and rise away from the substrate supporting part 10b to continue the process with the subsequent washing and drying treatment. The controlling unit 400 controls the substrate holding unit 200 to retrieve the substrate W from the substrate supporting part 10b of the spray treatment tank 30 as preparation for transport to the cleaning and drying tank 500. Because the cleaning and drying tank 500 is a horizontal washing machine, the substrate holding unit 200 needs to transport the substrate W from the spray treatment tank 30 to the second substrate flipping machine 700 and the substrate supporting part 10c so that the second substrate flipping machine 700 and the substrate supporting part 10c can flip the substrate W to be in the horizontal state such that the second substrate flipping machine 700 and the substrate supporting part 10c can place the substrate W in the horizontal state on the substrate supporting part 10d of the cleaning and drying tank 500 for execution of the horizontal washing and drying treatment. It is to be known that, because the mechanism combination of the second substrate flipping machine 700 and the substrate supporting part 10c is almost the same as the mechanism combination of the first substrate flipping machine 600 and the substrate supporting part 10, and because the action and the principle of holding and flipping the substrate W are the same, people skilled in the art can easily understand the details of the action of the second substrate flipping machine 700 and the substrate supporting part 10c holding and flipping the substrate W according to the abovementioned description of the first substrate flipping machine 600 and the substrate supporting part 10 holding and flipping the substrate W; there is no need for furthermore description of the action of the substrate flipping machine 700 and the substrate supporting part 10*c* holding and flipping the substrate W.

After the horizontal washing and drying treatment of the substrate W is completed, the controlling unit 400 will control the substrate inputting and outputting unit 800 to receive the substrate W, which is in the horizontal state, and output it to the outside, after which the wet treatment for the substrate W will be completed. It is to be known that, in the first embodiment, the substrate processing system 1 only processes one substrate W at one time in the wet treatment, but the substrate processing system 1 can also process a plurality of substrates W at one time in the wet treatment; the controlling unit 400 can control the substrate holding unit 200 to transport each of the substrates W from the soaking tank 20 to the spray treatment tank 30, the cleaning and drying tank 500 and the substrate inputting and outputting unit 800 sequentially to execute the complete wet treatment on each of the substrates W.

Figure 11:
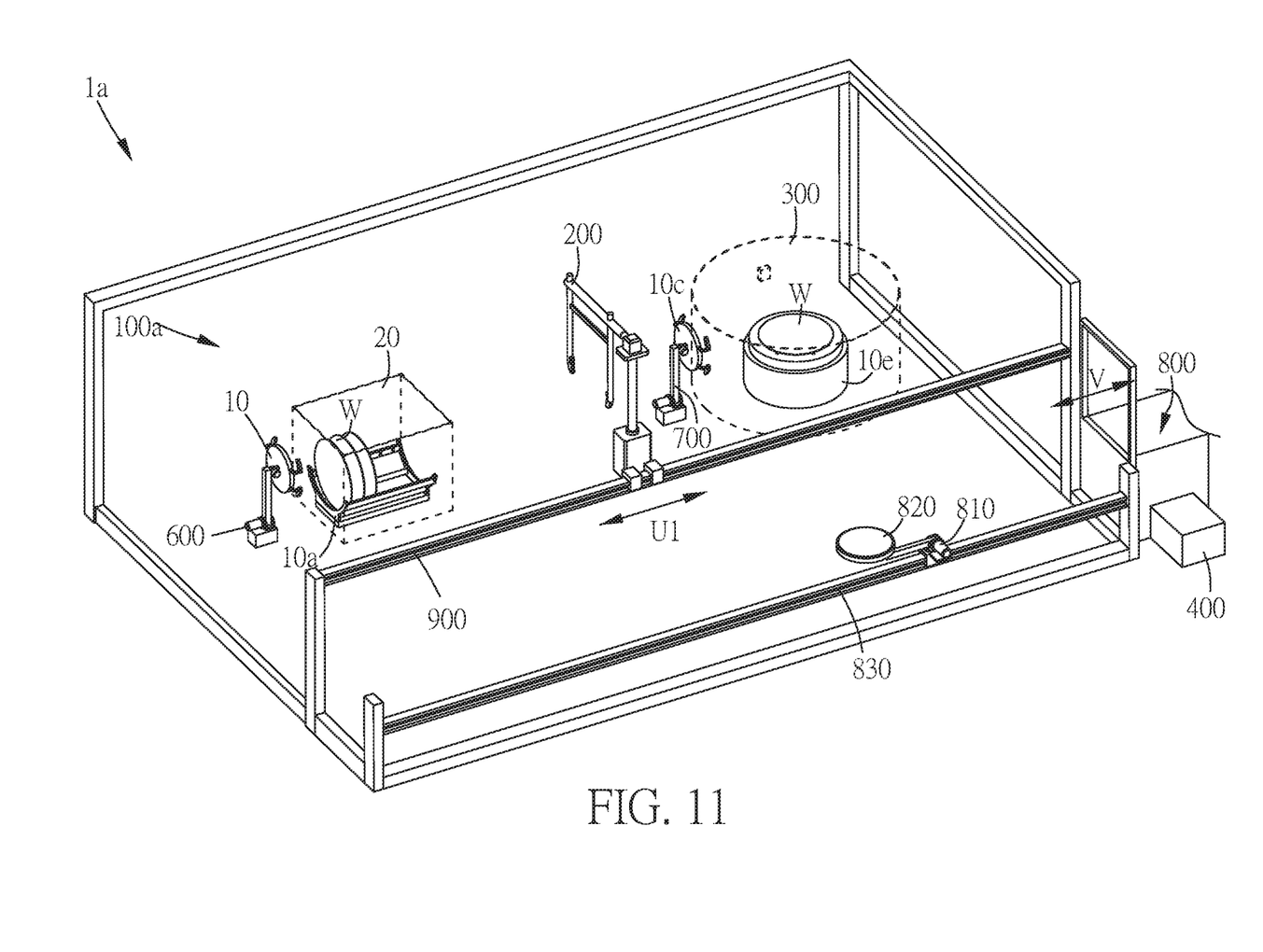
FIG. 11 illustrates a schematic drawing of the substrate processing system in a second embodiment of the present invention.

Please refer to FIG. 11, which illustrates the substrate processing system in a second embodiment of the present invention. FIG. 11 presents a schematic drawing of the substrate processing system in the second embodiment of the present invention.

As shown in FIG. 11, the difference between the second embodiment and the first embodiment is that, in the second embodiment, the substrate processing system 1*a* does not include the cleaning and drying tank 500, and the substrate processing system 1*a* further includes a horizontal spray treatment tank 300. The horizontal spray treatment tank 300 is used for execution of a spray treatment to the substrate W, such as a chemical liquid spray or pure water spray, but the spray type is not limited to that design. The substrate processing set 100*a* has a soaking tank 20 and a plurality of substrate supporting parts 10, 10*a*, 10*c*, 10*e*; the substrate processing set 100*a* does not include the spray treatment tank 30. The substrate supporting part 10*e* is located in the horizontal spray treatment tank 300 for containing a horizontal substrate W. During the wet treatment of the substrate W, the substrate holding unit 200 can cooperate with the first substrate flipping machine 600 and the substrate supporting part 10 to flip the substrate W to be in the vertical state and transport the substrate W into the soaking tank 20 of the substrate processing set 100*a* for execution of the soaking treatment. After the soaking treatment is completed, the substrate W will be transported from the soaking tank 20 to the second substrate flipping machine 700; the substrate supporting part 10*c* will flip the substrate W to be in the horizontal state and place the substrate W on the substrate supporting part 10*e* in the horizontal spray treatment tank 300 for execution of the spray treatment.

Figure 12:
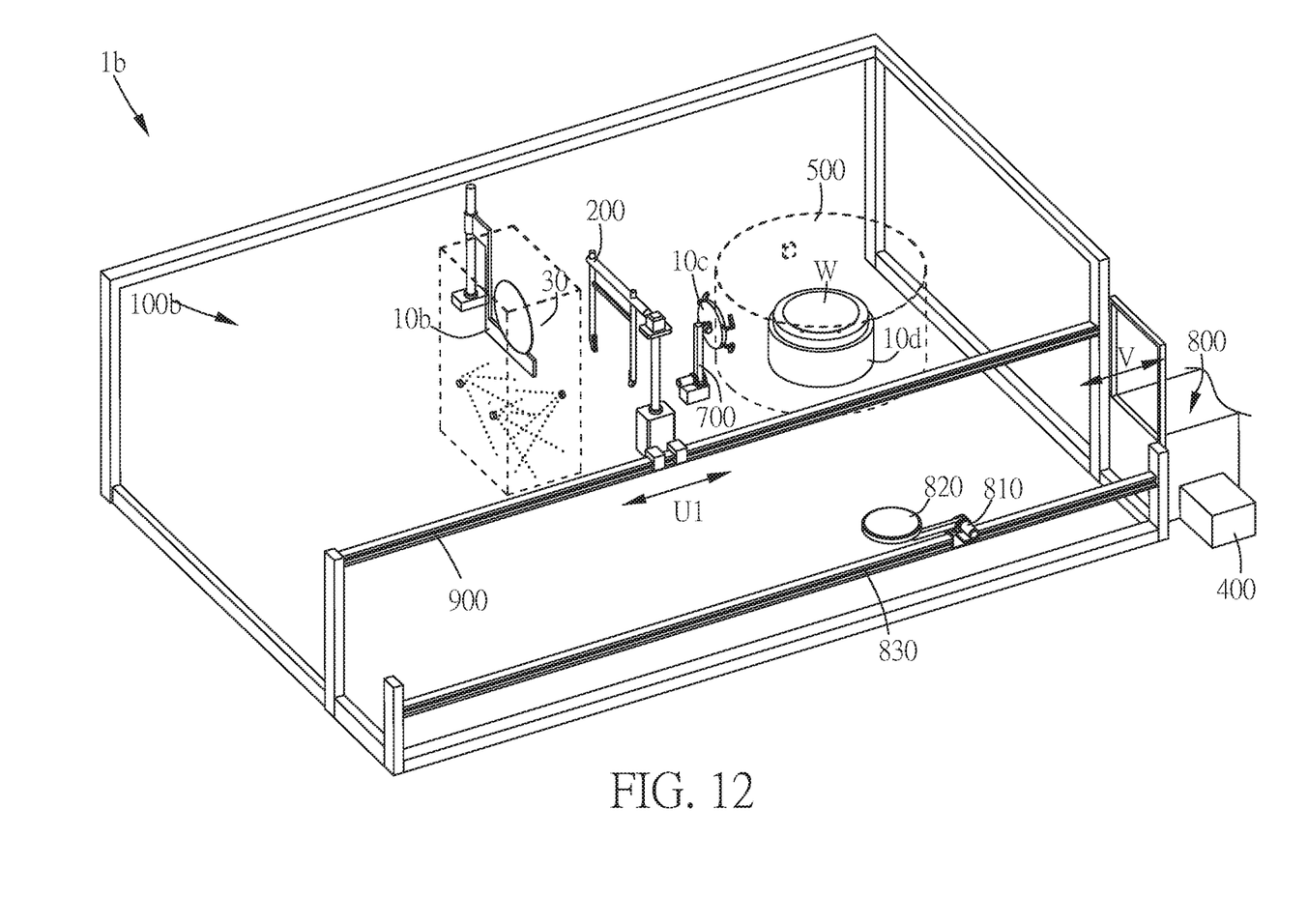
FIG. 12 illustrates a schematic drawing of the substrate processing system in a third embodiment of the present invention.

Please refer to FIG. 12, which illustrates the substrate processing system in a third embodiment of the present invention. FIG. 12 presents a schematic drawing of the substrate processing system in the third embodiment of the present invention.

As shown in FIG. 12, the difference between the third embodiment and the first embodiment is that, in the third embodiment, the substrate processing set 100*b* of the substrate processing system 1*b* has a spray treatment tank 30 and a plurality of substrate supporting parts 10, 10*b*, 10*c*, 10*d*; the substrate processing set 100*b* does not have the soaking tank 20. During the wet treatment of the substrate W, the substrate holding unit 200 can cooperate with the first substrate flipping machine 600 and the substrate supporting part 10 to flip the substrate W to be in the vertical state and transport the substrate W to the spray treatment tank 30 of the substrate processing set 100*b* for execution of the spray treatment. After the spray treatment is completed, the substrate W will be transported from the spray treatment tank 30 to the second substrate flipping machine 700; the substrate supporting part 10*c* will flip the substrate W to be in the horizontal state and place the substrate W on the substrate supporting part 10*d* in the cleaning and drying tank 500 for execution of the washing and drying treatment. Finally, the controlling unit 400 will control the substrate inputting and outputting unit 800 to receive the substrate W, which is in the horizontal state, for being output to the outside.

Figure 13:
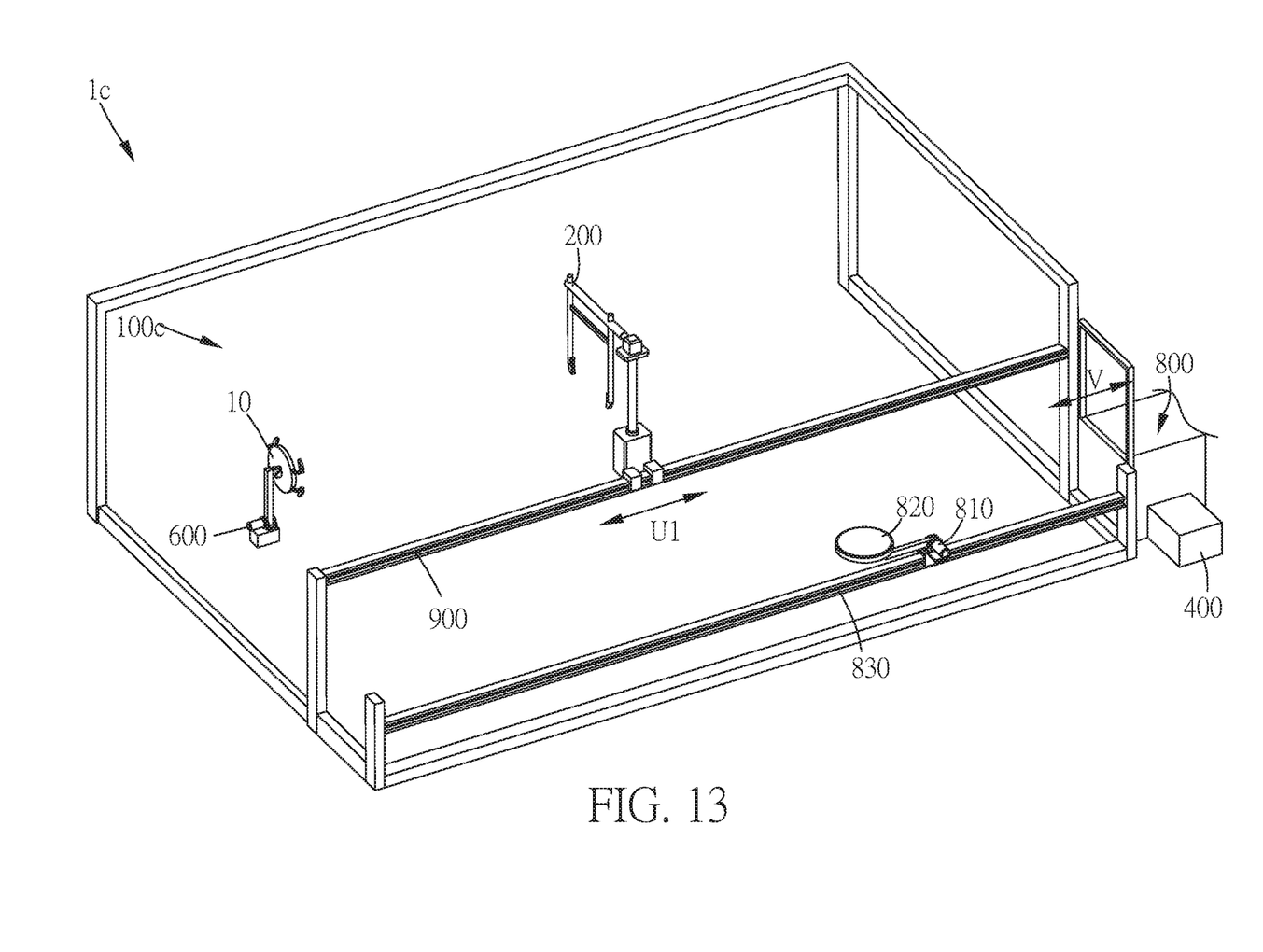
FIG. 13 illustrates a schematic drawing of the substrate processing system in a fourth embodiment of the present invention.

Please refer to FIG. 13, which illustrates the substrate processing system in a fourth embodiment of the present invention. FIG. 13 presents a schematic drawing of the substrate processing system in the fourth embodiment of the present invention.

As shown in FIG. 13, the difference between the fourth embodiment and the first embodiment is that, in the substrate processing system 1*c* of the fourth embodiment, the substrate processing system 1*c* does not include the cleaning and drying tank 500 and the second substrate flipping machine 700. The substrate processing set 100*c* only includes a substrate supporting part 10, and the substrate supporting part 10 is located on the first substrate flipping machine 600. The substrate processing set 100*c* is used for flipping the substrate between the horizontal state and the vertical state and for transporting the substrate in the vertical state with the substrate holding unit 200. The user can place the substrate treatment machine next to the sliding rail set 900 according to the treatment requirement for the substrate; whereby, the substrate processing set 100*c* and the substrate holding unit 200 can flip the substrate between the horizontal state and the vertical state according to the different substrate treatment machines and place the substrate which is flipped onto the substrate treatment machine.

Via the structural design of the substrate processing system of the present invention, it can easy hold, place and transport a substrate in the vertical state and flip the substrate between the horizontal state and the vertical state to accommodate the different machines for execution of the soaking, vibration soaking, horizontal or vertical spray, and washing and drying treatments.

The substrate of the present invention can be a substrate form, a carrier form, a wafer form, or a chip form, and the shape of the substrate can be round, square, or other shapes. The substrate processing system of the present invention can be applied to wet treatment with the etching, cleaning and drying processes for a substrate such as single substrate wet treatment, multiple-substrate wet treatment, metal etching under the single-sided wafer solder ball treatment, thinned wafer supporting and stripping treatment, attaching and stripping treatment, silicon carbide wafer regeneration treatment, or silicon wafer regeneration treatment, but the type of treatment is not limited to the abovementioned design.

Please note that the above embodiments are preferred embodiments of the present invention and are not intended to limit the scope of the present invention. It is to be understood by those skilled in the art that the abovementioned elements are not all essential elements. Furthermore, in order to implement the present invention, other detailed known elements might be included as well. Each element can be omitted or modified according to different needs.

In summary, regardless of the purposes, means and effectiveness, this invention is quite different from the known technology and should merit the issuing of a new patent. However, it is noted that many of the above-mentioned embodiments are only for illustrative purposes; the claims of the invention should depend on the claims and not be limited to the embodiments.

What is claimed is:

1. A substrate processing system, comprising:
   a substrate processing set, comprising at least one substrate supporting part, wherein the at least one substrate supporting part is used for supporting a substrate which is vertical; and
   a substrate holding unit, comprising two cantilevers and two substrate holding parts, each of the two substrate holding parts being respectively located on each of the two cantilevers,
   wherein the two substrate holding parts are used for vertically holding the substrate;
   wherein when the substrate holding unit moves close to the substrate processing set, and the two substrate holding parts contact the substrate, the two substrate holding parts hold the substrate;
   wherein a process of the substrate holding unit holding the substrate comprises the steps of:
   the two substrate holding parts descending to be lower than a first height of the substrate;
   the two substrate holding parts moving horizontally to the substrate and the two substrate holding parts respectively being aligned with two sides of the substrate;
   the two substrate holding parts ascending to contact the two sides of the substrate; and
   the two substrate holding parts ascending and holding the substrate such that the substrate leaves the at least one substrate supporting part.

2. The substrate processing system as claimed in claim 1, wherein the substrate holding unit is further used for holding the substrate and placing the substrate into the substrate processing set, wherein a process of the substrate holding unit holding the substrate and placing the substrate into the substrate processing set comprises the steps of:
   the two substrate holding parts holding the substrate and descending to place the substrate on the substrate supporting part;
   the two substrate holding parts descending to be lower than the first height and leaving the substrate;
   the two substrate holding parts moving horizontally to a first distance to leave the substrate; and
   the two substrate holding parts ascending to leave the substrate processing set.

3. The substrate processing system as claimed in claim 2, wherein each of the two substrate holding parts comprises a trench and each of the two trenches comprises a bottom spacing and a top spacing, the bottom spacing being less than the top spacing, and the two trenches being located symmetrically to respectively contact the two sides of the substrate, wherein via a size relationship of the bottom spacing being less than the top spacing, the two substrate holding parts can ascend and hold the substrate to leave the at least one substrate supporting part, or the two substrate holding parts can descend to put the substrate on the at least one substrate supporting part and leave the substrate.

4. The substrate processing system as claimed in claim 2, wherein each of the two substrate holding parts comprises a trench, the two trenches being located symmetrically to respectively contact the two sides of the substrate; a slot spacing between a top of each of the two trenches is larger than another slot spacing between a bottom of each of the two trenches, wherein via a wide-top-and-narrow-bottom shape of each of the two trenches, the two substrate holding parts can ascend and hold the substrate to leave the at least one substrate supporting part, or the two substrate holding parts can descend to place the substrate on the at least one substrate supporting part and leave the substrate.

5. The substrate processing system as claimed in claim 2, wherein the substrate processing set is a substrate flipping machine for flipping the substrate between a horizontal state and a vertical state and for transporting the substrate which is vertical with the substrate holding unit.

6. The substrate processing system as claimed in claim 5, wherein the at least one substrate supporting part comprises at least one container; when the substrate is flipped between the horizontal state and the vertical state, a edge of the substrate is fixed in the at least one container; when the substrate is in the vertical state, the substrate is erect on the at least one container such that the substrate holding unit can transport the substrate.

7. The substrate processing system as claimed in claim 2, wherein the substrate processing set is a spray treatment tank for executing a vertical spray treatment on the substrate and for transporting the substrate which is vertical with the substrate holding unit.

8. The substrate processing system as claimed in claim 2, wherein the substrate processing set is a soaking tank for executing a vertical soaking treatment on the substrate and transporting the substrate which is vertical with the substrate holding unit.

9. The substrate processing system as claimed in claim 8, wherein the soaking tank comprises a plurality of slots, the plurality of slots being located on the at least one substrate supporting part, for containing a plurality of substrates; the substrate holding unit vertically and sequentially places each of the plurality of substrates on the plurality of slots for execution of a batch immersion treatment on the plurality of substrates.

10. The substrate processing system as claimed in claim 8, wherein the soaking tank comprises a plurality of slots, the plurality of slots being located on the at least one substrate supporting part, for containing the plurality of substrates, wherein the substrate holding unit vertically places one of the substrates on one of the slots for execution of a soaking treatment on the substrate, and the substrate holding unit successively transports other substrates to the soaking tank to successively execute the soaking treatment on each of the substrates.

11. The substrate processing system as claimed in claim 10, wherein during a process of the substrate holding unit successively transporting each of the substrates to the soaking tank for execution of the soaking treatment, any substrates in the soaking tank are still in the soaking treatment.

12. The substrate processing system as claimed in claim 10, wherein a gap between two neighboring slots is at least more than the first distance such that the substrate holding unit can ascend and descend to enter and leave the soaking tank.

13. The substrate processing system as claimed in claim 8, further comprising a horizontal spray treatment tank; when the substrate is moved from the soaking tank to the horizontal spray treatment tank, a spray treatment is executed on the substrate.

14. The substrate processing system as claimed in claim 8, wherein the soaking tank further comprises a vibration device; the vibration device causes the at least one substrate supporting part to vibrate for execution of a vibration soaking treatment on the substrate.

15. The substrate processing system as claimed in claim 14, wherein the two substrate holding parts can ascend and hold the substrate to leave the at least one substrate supporting part which vibrates, or the two substrate holding parts can descend to place the substrate on the at least one substrate supporting part which vibrates and leave the substrate.

16. The substrate processing system as claimed in claim 2, further comprising a controlling unit for controlling a wet treatment for each of the substrates, wherein the substrate processing set further comprises a soaking tank and a spray treatment tank; an amount of the at least one substrate supporting part is plural, two of the substrate supporting parts being respectively located in the soaking tank and the spray treatment tank; the soaking tank comprises a plurality of slots for containing the plurality of substrates, and the plurality of slots are located on the substrate supporting part in the soaking tank, wherein the controlling unit controls the substrate holding unit to transport each of the plurality of substrates to the soaking tank for execution of a soaking treatment on each of the plurality of substrates, wherein the controlling unit controls the substrate holding unit to transport each of the plurality of substrates to the spray treatment tank from the soaking tank for execution of a spray treatment on each of the plurality of substrates.

17. The substrate processing system as claimed in claim 16, further comprising a cleaning and drying tank, wherein the controlling unit controls the substrate holding unit to move each of the plurality of substrates to the cleaning and drying tank from the spray treatment tank for washing and drying of each of the plurality of substrates.

18. The substrate processing system as claimed in claim 17, further comprising a first substrate flipping machine, wherein one of the substrate supporting parts is located on the first substrate flipping machine, and the first substrate flipping machine flips the substrate to be in a vertical state to transport the substrate with the substrate holding unit; the controlling unit controls the substrate holding unit to move the substrate to the soaking tank from the first substrate flipping machine for execution of the soaking treatment on the substrate.

19. The substrate processing system as claimed in claim 18, further comprising a second substrate flipping machine, wherein one of the substrate supporting parts is located on the second substrate flipping machine; a process of the controlling unit controlling the substrate holding unit to move the substrate to the cleaning and drying tank from the spray treatment tank for washing and drying of each of the plurality of substrates comprises the steps of:

the substrate holding unit transporting the substrate to the second substrate flipping machine from the spray treatment tank;

the second substrate flipping machine flipping the substrate to be in a horizontal state; and the second substrate flipping machine placing the substrate into the cleaning and drying tank to be washed and cleaned horizontally.

20. The substrate processing system as claimed in claim 19, further comprising a substrate inputting and outputting unit, wherein the plurality of substrates enter or leave the substrate processing system via the substrate inputting and outputting unit, wherein the controlling unit controls the substrate inputting and outputting unit to transport the substrate in the horizontal state to the first substrate flipping machine to start the wet treatment of the substrate; the controlling unit also controls the substrate inputting and outputting unit to receive the substrate in the horizontal state from the cleaning and drying tank to complete the wet treatment of the substrate.

* * * * *